US012785676B2

(12) United States Patent
Zipper et al.

(10) Patent No.: US 12,785,676 B2
(45) Date of Patent: Nov. 3, 2026

(54) POWER-ON RESET CIRCUITY FOR LOW BATTERY VOLTAGES

(71) Applicant: Renesas Design Austria GmbH, Graz (AT)

(72) Inventors: Josef Zipper, Graz (AT); Lukas Niederwieser, Graz (AT)

(73) Assignee: Renesas Design Austria GmbH, Graz (AT)

( * ) Notice: Subject to any disclaimer, the term of this patent is extended or adjusted under 35 U.S.C. 154(b) by 10 days.

(21) Appl. No.: 18/983,798

(22) Filed: Dec. 17, 2024

(65) Prior Publication Data

US 2026/0172024 A1 Jun. 18, 2026

(51) Int. Cl.
*H03K 17/22* (2006.01)
*G01R 19/165* (2006.01)

(52) U.S. Cl.
CPC ..... *H03K 17/223* (2013.01); *G01R 19/16519* (2013.01)

(58) Field of Classification Search
CPC ........ H03K 17/22; H03K 17/223; H03K 5/01; H03K 5/08; H03K 5/082; H03K 5/0824; H03K 5/22; H03K 5/24; G01R 19/165; G01R 19/16504; G01R 19/16519; G01R 19/16566; G01R 19/16571; G01R 19/16576; G06F 1/24
See application file for complete search history.

(56) References Cited

U.S. PATENT DOCUMENTS 7,466,172 B2 * 12/2008 Liu .................. G01R 19/16552
327/143
2024/0168508 A1 * 5/2024 Hashemi .................. G06F 1/26

* cited by examiner

*Primary Examiner* — Long Nguyen
(74) *Attorney, Agent, or Firm* — SCULLY, SCOTT, MURPHY & PRESSER, P.C.

(57) ABSTRACT

An integrated circuit with a power-on reset circuitry to activate the rest of the integrated circuit based on an external supply voltage supplied at a supply pin of the integrated circuit. The power-on reset circuity includes a fine POR detector built to compare the external supply voltage with a bandgap reference voltage, generated by a bandgap module of the integrated circuit, to detect a rise of the external supply voltage beyond a power-on reset threshold voltage to reset the integrated circuit at power-on and a low-dropout regulator to provide an intermediate supply voltage for internal blocks of the integrated circuit that would be damaged by a higher damage voltage which damage voltage is below a maximal voltage of the external supply voltage at the supply pin.

4 Claims, 2 Drawing Sheets

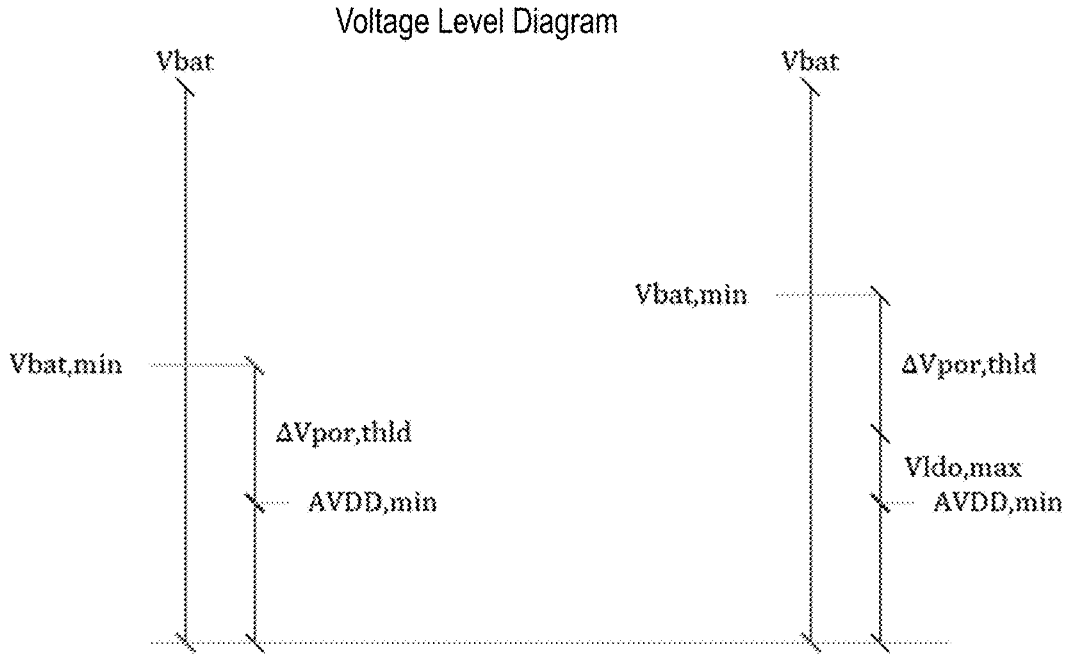
Fig. 1A
Fig. 1B
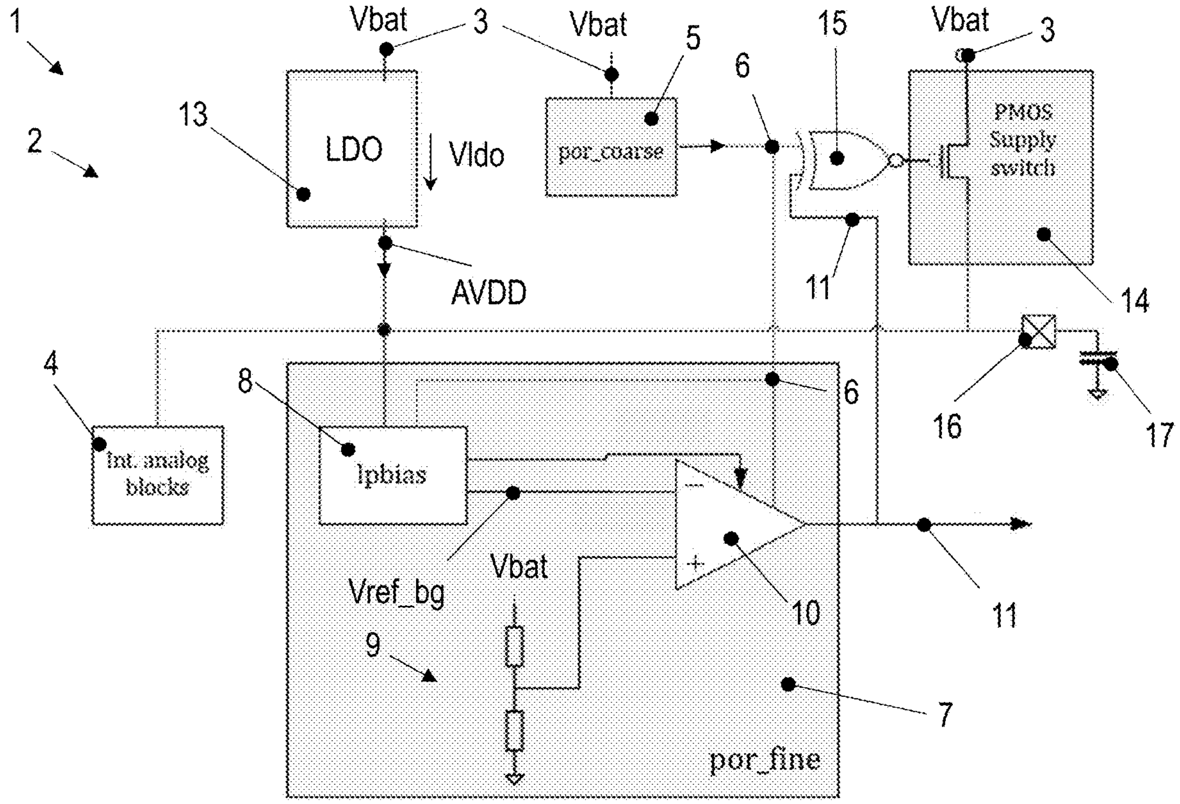
Fig. 2

ΔVpor_fine,thld … Variation of fine POR detector 7
ΔVpor_coarse,thld . Variation of coarse POR detector 5
Vldo,max ………… Max. voltage drop on low-dropout regulator 13
Vpor_fine,min …… Min. supply needed for fine POR detector 7
AVDD,min ………. Min. intermediate supply voltage needed for analog blocks 4

POWER-ON RESET CIRCUITY FOR LOW BATTERY VOLTAGES

FIELD

The present invention relates to an integrated circuit with a power-on reset circuitry to activate the rest of the integrated circuit based on an external supply voltage supplied at a supply pin of the integrated circuit.

BACKGROUND

In nowadays world many products, especially in the internet of things area, are supplied with rechargeable batteries. As the devices become smaller also the battery voltages scale down, and in many products coin cells with battery voltages as low as 2.7V are very common. At the same time charging of the battery via a common USB-port is a mandatory requirement. The typical voltages of an USB-port are 5V. Therefore, the required operating voltage of the integrated circuit of such a product must span a large range. The minimum voltage of an external battery to supply and power such a product is set by the minimum supply voltage Vbat, min to activate an integrated circuit of the product and the maximum supply voltage Vbat, max is set by the maximum USB-voltage.

Inside an integrated circuit the block responsible for activation is called the power-on-reset circuity. Its threshold voltage Vpor,thld determines at which battery voltage the system boots up or stays off. Due to process and temperature variations this threshold has also a certain variation of the threshold voltage ΔVpor,thld. To operate mainly analog blocks of the integrated circuit a minimum intermediate supply voltage AVDD,min is required. Therefore, AVDD, min and ΔVpor,thld together determine the minimum supply voltage Vbat,min for which the integrated circuit is functional, as can be seen in FIG. 1A. The maximum supply voltage Vbat,max is given by the 5V from the USB during charging. If the internal blocks of the integrated circuit are directly connected to the external supply voltage of the battery, maximal intermediate supply voltage AVDD,max is equal to the maximum supply voltage Vbat,max, and all transistors must be able to sustain that voltage.

In standard deep-submicron processes (e.g. <130 nm technology) only dedicated, bulky high voltage HV-MOS transistors with typically degraded performance are available to directly connect to a 5V-USB-supply. Consequently, circuit design with these transistors is exacerbated and the majority of analog blocks is implemented using so called IO-MOS transistors with maximum sustainable voltages of 3.6V. Hence, in these processes the analog intermediate supply voltage AVDD is usually generated internally by a low-dropout regulator which needs a required voltage Vldo between its input and output to provide the intermediate supply voltage AVDD. In the context of the minimum operation voltage of such an integrated circuit, the required voltage Vldo adds up to minimum intermediate supply voltage AVDD,min and the variation of the threshold voltage ΔVpor,thld, and increases the minimum supply voltage Vbat,min as can be seen in FIG. 1B.

An example is given to underline the problematic of state of the art power-on reset circuity: AVDD,min=2.25V (=2.5V-10%), Vldo,max=0.25V, ΔVpor,thld=0.5V=>Vbat, min=3V For lower minimum supply voltages Vbat,min the minimum intermediate analog-supply AVDD,min cannot be maintained and the functionality of the analog blocks cannot be guaranteed.

In the effort to lower the minimum supply voltage Vbat, min to enable operation of the integrated circuit with an external small battery for a given minimum analog supply AVDD,min the following approaches can now be made:

- Avoiding a maximal required voltage Vldo,max between input and output of the low-dropout regulator by using larger process nodes, connecting analog blocks directly to external supply voltage Vbat, and thereby omitting the low-dropout regulator. But this contradicts with high integration density requirement.
- Reduction of the variation of the threshold voltage ΔVpor, thld.

The design of power-on reset circuits with low variation of the threshold voltage ΔVpor,thld is exacerbated by several challenging requirements:

- Low current consumption: The power-on reset circuity must be also active for battery voltages below minimum supply voltage Vbat,min. Therefore its current consumption directly contributes to the integrated circuits off-current and related battery life.
- Low threshold variation ΔVpor,thld requires any kind of accurate reference, like for instance a bandgap reference. Simple power-on reset circuits inherently use the transistor's threshold voltage (MOS threshold voltage) as reference, which however varies strongly with process and temperature.
- Since the power-on reset circuity senses the external battery supply of the integrated circuit, it must sustain voltages up to 5V from USB. In deep-submicron processes this requires high voltage HV-MOS transistors, and hence excludes complex circuits for low threshold variations ΔVpor,thld (e.g. bandgap reference connected directly to external supply voltage Vbat)

State of the art implementations therefore are trade-offs between the parameters off-current consumption, minimum battery voltage for activation and available MOS-devices in the target technology. For instance in a technology with 5V-capable standard MOS transistors (e.g. >130 nm processes) it is possible to design a bandgap reference with direct-to-battery-supply and a current consumption in lower μA-range. An accurate reference for the power-on reset circuity therefore is available to define a low-variation of the threshold voltage ΔVpor,thld.

Likewise, in deep-submicron technologies without 5V-capable standard MOS devices, a standard approach is to implement a simple low-current direct-to-battery supplied power-on reset circuity with high voltage HV-MOS transistors in diode configuration. Such a topology takes the transistor's threshold voltage as reference, which however underlies strong temperature and process dependencies. A larger variation of the threshold voltage ΔVpor,thld, and hence increased minimum supply voltage Vbat,min for activation is the result.

Similarly, in deep-submicron technologies an accurate bandgap reference could be implemented with 3.6V-IO-MOS transistors and with μA-current consumption, but supplied by an internal low-dropout regulator. As described above, the supply generation would require a certain required voltage Vldo between its input and output and again limits the required minimum supply voltage Vbat,min for activation of the integrated circuit.

SUMMARY

It is an object of the invention to provide an integrated circuit with a power-on reset circuity with accurate threshold detection to achieve low minimum operating voltages, especially suitable, but not limited to, deep-submicron processes.

This object is achieved with an integrated circuit as claimed in claim 1.

A switch of the inventive power-on reset circuity is built to enable in a first switch mode to connect the internal blocks and bandgap module with the supply pin and disconnect them from the intermediate supply voltage during ramp-up of the external supply voltage before the power-on reset. This direct connection of the internal blocks with the external supply voltage enables a low minimum supply voltage Vbat,min as shown in FIG. 1A. The switch furthermore is built to enable in a second switch mode to connect the internal blocks with the intermediate supply voltage and disconnect them from the supply pin after power-on reset. This ensures protection of the internal blocks against too high voltages which could damage them and ensures a minimal variation of the threshold voltage ΔVpor,thld due to the accurate bandgap reference voltage of the bandgap module powered by the intermediate supply voltage.

In a preferred embodiment the power-on reset circuity comprises a coarse POR detector built with high voltage sustainable MOS transistors to compare the external supply voltage Vbat with a MOS threshold voltage Vpor_coarse,thld and to provide a coarse power-on reset signal, if during ramp-up the external supply voltage Vbat exceeds the MOS threshold voltage Vpor_coarse,thld and, wherein a switch enabler module is built to activate the first switch mode upon detection of the coarse power-on reset signal. This ensures that for time periods where the external supply voltage Vbat is below the MOS threshold voltage Vpor_coarse,thld the intermediate supply voltage AVDD is not generated what reduces the current consumption and minimum supply voltages Vbat,min as shown in the comparison of FIG. 1A and FIG. 1B.

This inventive concept is dedicated, but not limited, to deep-submicron technologies (<130 nm) with the assumption of the analog intermediate supply voltage AVDD usually generated internally by a low-dropout regulator, and presents an approach which breaks above described trade-offs of the state of the art solutions by following novel concepts:

1. A 2-step threshold detection mechanism as explained above: For external supply voltages Vbat below a coarse POR-threshold a simple direct-to-battery supplied block with μA-current consumption is active, which triggers based on a MOS-threshold-voltage reference Vpor_coarse,thld used as POR-threshold. The coarse POR detector activates a fine-POR detector employing a bandgap-reference with slightly increased current consumption (~1 μA) and an accurate POR-threshold for eventual chip-boot-up. The final variation of the threshold voltage ΔVpor,thld is only about 100 mV.
2. For lower voltage ranges during ramp-up of the external supply voltage Vbat the intermediate analogue supply voltage AVDD is shorted to the battery supply via the switch. This eliminates the dropout voltage of the low-dropout regulator and allows higher minimum supply voltages Vbat,min for the design of the fine POR detector.

In a further preferred embodiment the switch is connected to a large external decoupling capacitor, which is connected to the integrated circuit via a pin of the integrated circuit. The switch in its first switch mode is built to pre-charge the decoupling capacitor with the ramping-up external supply voltage Vbat what helps to speed-up to charge the decoupling capacitor.

These and other aspects of the invention will be apparent from and elucidated with reference to the embodiments described hereinafter. The person skilled in the art will understand that various embodiments may be combined.

BRIEF DESCRIPTION OF THE DRAWINGS

FIG. 1A and FIG. 1B show voltage level diagrams for the minimum supply voltage Vbat,min of an integrated circuit with and without a low-dropout regulator to provide an intermediate supply voltage.

FIG. 2 shows a block diagram of first embodiment of a power-on reset circuit according to the invention.

DETAILED DESCRIPTION OF EMBODIMENTS

Figure 3:
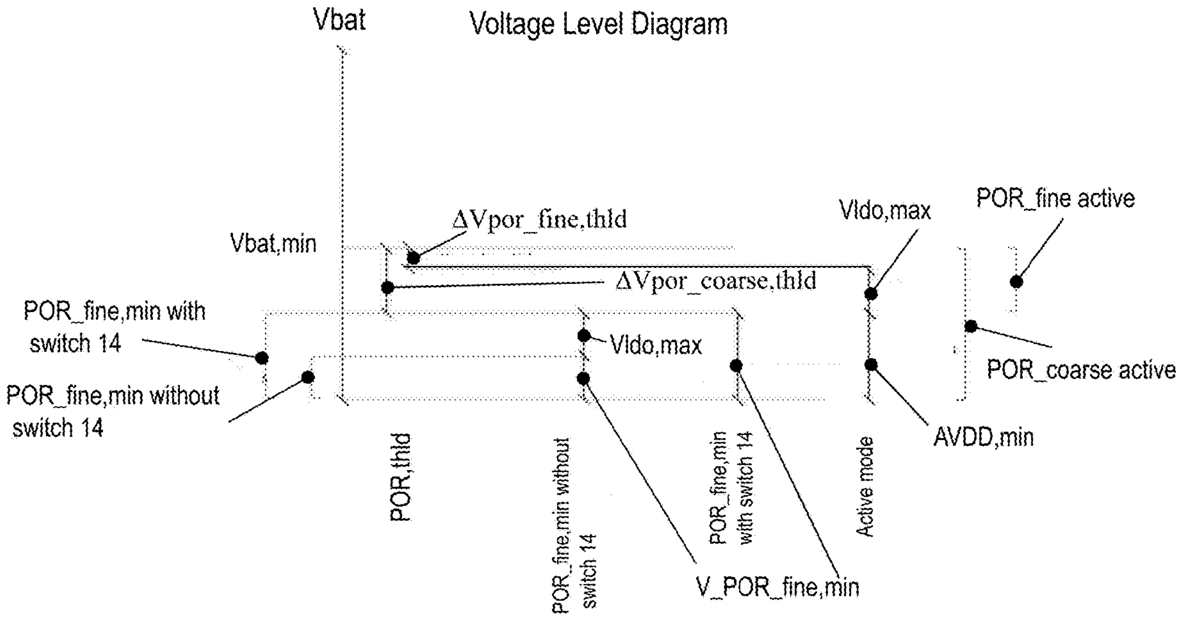
FIG. 3 shows voltage level diagrams of the power-on reset circuit according to FIG. 2.

FIG. 2 shows a first embodiment of an integrated circuit 1 with a power-on reset circuitry 2 to activate other blocks of the integrated circuit 1 based on an external supply voltage Vbat supplied at a supply pin 3 of the integrated circuit 1. The majority of integrated circuit 1 has been manufactured in a standard deep-submicron processes (e.g. <130 nm) and for instance internal analog blocks 4 are implemented using so called IO-MOS transistors with maximum sustainable voltages of 3.6V. Only a few dedicated, bulky high voltage HV-MOS transistors of integrated circuit 1 with typically degraded performance are available to directly connect to a 5V-USB-supply. With these high voltage HV-MOS transistors a coarse POR detector 5 is built to compare the external supply voltage Vbat with a MOS threshold voltage Vpor_coarse,thld and to provide a coarse power-on reset signal 6, if during ramp-up of the external supply voltage Vbat exceeds the MOS threshold voltage Vpor_coarse,thld, which is derived from the MOS threshold voltage and therefore exhibits a quite large variation ΔVpor_coarse,thld of about 0.5V. The quiescent current of this coarse POR detector 5 is about 100 nA during operation.

The power-on reset circuity 2 furthermore comprises a fine POR detector 7 built to compare the external supply voltage Vbat with an accurate bandgap reference voltage Vref_bg, generated by a bandgap module 8 of the fine POR detector 7, to detect a rise of the external supply voltage Vbat beyond a power-on reset threshold voltage Vpor_fine,thld. A high-ohmic voltage divider 9 is used to scale down the external supply voltage Vbat to provide it as second input to a comparator 10. The fine POR detector 7 is enabled by the coarse power-on reset signal 6 of the coarse POR detector 5. All blocks of fine POR detector 7 are designed for low current consumption. The output signal of the fine POR detector 7 is a fine power-on reset signal 11, which changes to logic high once external supply voltage Vbat exceeds an accurate fine POR-threshold Vpor_fine,thld. This fine power-on reset signal 11 eventually controls the boot-up of integrated circuit 1.

Integrated circuit 1 furthermore comprises a low-dropout regulator 13 to provide an intermediate supply voltage AVDD for the internal analog blocks 4 of the integrated circuit 1 that would be damaged by a higher damage voltage which damage voltage is below a maximal voltage of the external supply voltage Vbat,max at supply pin 3. This intermediate supply voltage AVDD allows the use of the IO-MOS transistors with max. terminal voltages of 3.6V. The intermediate supply voltage AVDD is furthermore used to supply bandgap module 8 of the fine POR detector 7.

Figure 4:
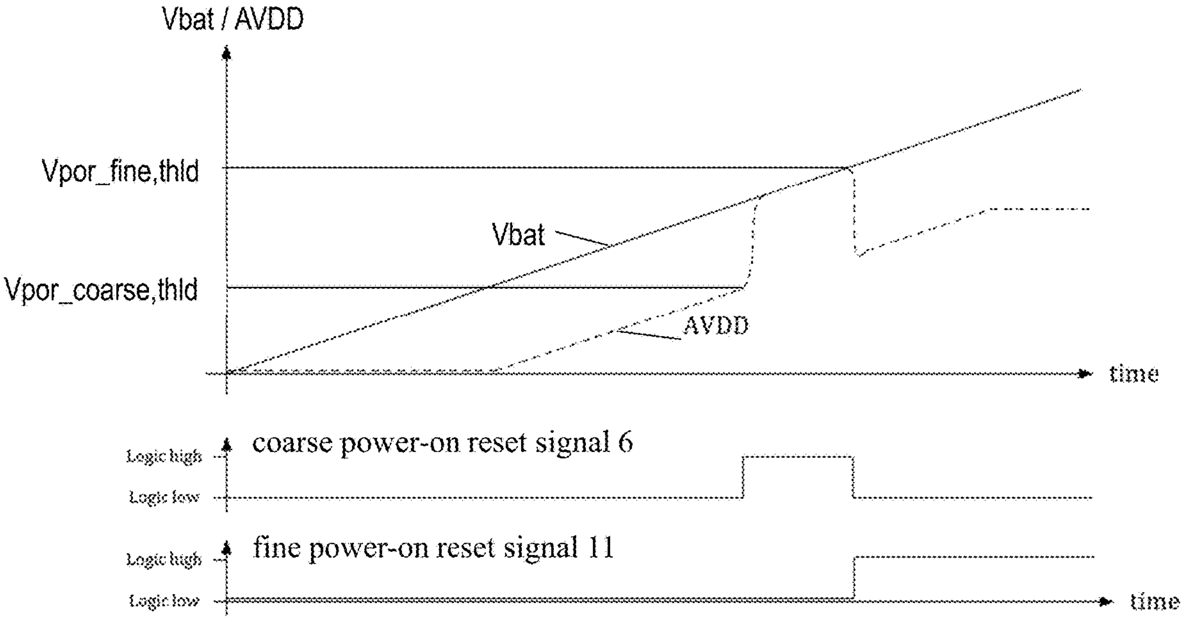
FIG. 4 shows time diagrams of the behavior of the power-on reset circuity according to FIG. 2 during ramp-up of the external supply voltage Vbat.

Integrated circuit 1 furthermore comprises a switch 14 built to enable in a first switch mode to connect the internal analog blocks 4 and bandgap module 8 with the supply pin 3 and disconnect them from the intermediate supply voltage AVDD during ramp-up of the external supply voltage Vbat before the power-on reset. In the preferred embodiment shown in FIG. 2, a switch enabler module 15 is built to activate the first switch mode upon detection of the coarse power-on reset signal 6, by activating the switch 14. Switch enabler module 15 is built as a logic gate and its second input is connected to fine power-on reset signal 11, which when logic high again deactivates switch 14 and therefore activates a second switch mode to connect the internal analog blocks 4 with the intermediate supply voltage AVDD and disconnect them from the supply pin 3 after power-on reset, as can be seen in FIG. 4.

The low-dropout regulator 13 needs a required Vldo between its input and output. Its input is connected to external supply voltage Vbat supplied at supply pin 3 and output of low-dropout regulator 13 is connected to the output of switch 14. As in first switch mode switch 14 directly connects its input supply pin 3 to the output of low-dropout regulator 13, both input and output of low-dropout regulator 13 are connected to external supply voltage Vbat, what deactivates low-dropout regulator 13. Therefore switch 14 is built to deactivate the generation of the intermediate supply voltage AVDD in the first switch mode and is built to activate the generation of the intermediate supply voltage AVDD in the second switch mode, when there is the required voltage Vldo between the input and output of low-dropout regulator 13. In this example switch 14 is implemented using a PMOS-transistor. Other implementations, however, may also be possible. By shorting low-dropout regulator 13 it avoids losing supply head-room, helps the fine POR detector 7 to operate at lower external supply voltage Vbat ranges and consequently allows the implementation of lower external supply voltage Vbat chip activation thresholds.

Integrated circuit 1 furthermore comprises an output pin 16 and a large external decoupling capacitor 17 is connected to output pin 16. Switch 14 via output pin 16 is connected to the large external decoupling capacitor 17 and switch 14 is built in its first switch mode to pre-charge the decoupling capacitor 17 with the ramp-up external supply voltage Vbat, what speeds-up the power-on procedure of the product that comprises the integrated circuit 1.

FIG. 3 shows voltage level diagrams of the power-on reset circuity 2 according to FIG. 2. FIG. 4 shows a time diagram of the behavior of the power-on reset circuity 2 according to FIG. 2 during ramp-up of the external supply voltage Vbat. As one possible example the following numerical values may be assumed:

- required voltage Vldo,max=0.25V for the low-dropout regulator 13;
- minimum intermediate supply voltage AVDD,min=2.25V (2.5V−10%),
- variation of MOS-threshold-voltage reference ΔVpor_coarse,thld=0.5V
- fine POR detector 7 achieves variation of ΔVpor_fine, thld=0.1V.

As can be seen in FIG. 3 on the right side, the coarse POR detector 5 is active as soon as external supply voltage Vbat ramps up, whereas the fine POR detector 7 is only activated once the coarse POR threshold is exceeded.

From the diagram in FIG. 3 it becomes clear that the minimum battery voltage for operation ("Active mode"), Vbat,min, is obtained by the minimum analog voltage AVDD,min, needed for operation of analog blocks 4 plus the maximum voltage drop VLDO,max on low-dropout regulator 13, and the maximum variation of the fine POR detector, ΔVpor_fine,thld, and results in 2.6V.

The advantage of the usage of switch 14 lies in the minimum supply for the fine POR detector 7: in FIG. 3 ("POR fine,min with the switch 14") it equates to Vbat,min minus the variation of the coarse POR detector 5, ΔVpor_coarse,thld and results in 2.1V. In the absence of switch 14 (FIG. 3 "POR fine,min without switch 14") it is additionally reduced by the required voltage, Vldo,max to activate low-dropout regulator 13, and becomes only 1.85V.

Several further different embodiments of controlling this switch 14 may be possible:

- Another embodiment could enable switch 14 only between initial Vbat-ramp until the coarse POR detector 5 triggers. Since the direct connection is disabled during the active phase of the fine POR detector 7, this detector must be functional for a lower operating range. However, in this embodiment the switch 14 could help to faster ramp up the intermediate supply voltage AVDD.
- In again another embodiment switch 14 could be enabled in the previously described ways, but stay enabled throughout the rest of the boot-up and even in active mode as long as external supply voltage Vbat is below the maximal allowed operating voltage of the IO-MOS-transistors (i.e. 3.6V). An own voltage monitor is then needed to disable switch 14 in case external supply voltage Vbat further increases (e.g. by connecting the IC to USB).

Above explained power-on reset circuitry 2 could be realized in integrated circuit 1 that furthermore comprises a wireless data interface that is realized as NFC interface that complies with the standard ISO18.092, just to give one concrete example.

The invention claimed is:

1. An integrated circuit with a power-on reset circuitry to activate the rest of the integrated circuit based on an external supply voltage supplied at a supply pin of the integrated circuit, the power-on reset circuitry (POR) comprising:

a fine POR detector built to compare the external supply voltage with a bandgap reference voltage, generated by a bandgap module of the integrated circuit, to detect a rise of the external supply voltage beyond a power-on reset threshold voltage to reset the integrated circuit at power-on and a low-dropout regulator to provide an intermediate supply voltage for internal blocks of the integrated circuit, wherein the intermediate supply voltage is below a maximal voltage of the external supply voltage at the supply pin, wherein the power-on reset circuitry comprises:

a switch built to enable in a first switch mode to connect the internal blocks and the bandgap module with the supply pin and disconnect the internal blocks and the bandgap module from the intermediate supply voltage during the rise of the external supply voltage before the power-on reset and built to enable in a second switch mode to connect the internal blocks with the intermediate supply voltage and disconnect the internal blocks from the supply pin after the power-on reset.

2. The integrated circuit according to claim 1, wherein the power-on reset circuitry further comprises a coarse POR detector built with high voltage sustainable MOS transistors to compare the external supply voltage with a MOS threshold voltage and to provide a coarse power-on reset signal, if during the rise of the external supply voltage, the external supply voltage exceeds the MOS threshold voltage and, wherein a switch enabler module is built to activate the first switch mode upon detection of the coarse power-on reset signal.

3. The integrated circuit according to claim 1, wherein the switch is built to deactivate the generation of the intermediate supply voltage in the first switch mode and to activate the generation of the intermediate supply voltage in the second switch mode.

4. The integrated circuit according to claim 1, wherein the switch is connected to a large external decoupling capacitor, which is connected to the integrated circuit via a pin of the integrated circuit and wherein the switch in the first switch mode is built to pre-charge the decoupling capacitor with the rise of the external supply voltage.

* * * * *